United States Patent
Shibagaki et al.

(10) Patent No.: US 12,176,674 B2
(45) Date of Patent: Dec. 24, 2024

(54) LASER OSCILLATION DEVICE FOR DIRECT-DIODE LASER METHOD AND FAILURE DIAGNOSIS METHOD FOR LASER OSCILLATION DEVICE

(71) Applicant: Panasonic Intellectual Property Management Co., Ltd., Osaka (JP)

(72) Inventors: Ryunosuke Shibagaki, Osaka (JP); Masashi Samizo, Hyogo (JP); Hideki Ihara, Hyogo (JP); Yoshiyuki Hamano, Shiga (JP); Toshinori Hongu, Hyogo (JP); Naoki Kobayashi, Hyogo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 1094 days.

(21) Appl. No.: 17/081,955

(22) Filed: Oct. 27, 2020

(65) Prior Publication Data
US 2021/0044081 A1    Feb. 11, 2021

Related U.S. Application Data

(63) Continuation of application No. PCT/JP2019/016096, filed on Apr. 15, 2019.

(30) Foreign Application Priority Data

May 18, 2018   (JP) .................. 2018-096572

(51) Int. Cl.
*H01S 5/042* (2006.01)
*B23K 26/21* (2014.01)
*H01S 5/00* (2006.01)

(52) U.S. Cl.
CPC ............ *H01S 5/0014* (2013.01); *B23K 26/21* (2015.10); *H01S 5/042* (2013.01)

(58) Field of Classification Search
CPC ............ H01S 5/06825; H01S 5/06812; H01S 5/0617; B23K 26/21
See application file for complete search history.

(56) References Cited

U.S. PATENT DOCUMENTS 10,502,555 B2 * 12/2019 Nakamura ......... B23K 26/0884
2002/0150139 A1 * 10/2002 Koshimae ........... H01S 5/06808
372/75

(Continued)

FOREIGN PATENT DOCUMENTS

CN    107073643    8/2017
JP    11-233872    8/1999

(Continued)

OTHER PUBLICATIONS

English language translation of Search Report issued Dec. 18, 2023 in corresponding Chinese Patent Application No. 201980031956.9, with English-language translation.

(Continued)

*Primary Examiner* — Tod T Van Roy
*Assistant Examiner* — Fernanda Adriana Camacho Alanis
(74) *Attorney, Agent, or Firm* — Wenderoth, Lind & Ponack, L.L.P.

(57) ABSTRACT

A direct-diode laser oscillator 1 can emit laser light to a laser processing head 3 based on the driving commands received from a system controller 5, which can control a laser robot 4 including the laser processing head 3. The direct-diode laser oscillator 1 includes the following: laser modules 10 each including a plurality of laser diodes connected in series or in parallel; a power supply circuit 20 for driving the laser modules 10 at a constant current, and a power controller 30

(Continued)

diagnosis map for controlling the power supply circuit 20 based on the driving commands and performing a fault diagnosis of the laser oscillator 1 based on which one of a plurality of previously divided regions of a diagnosis map the current and voltage applied to the laser modules 10 belong to.

6 Claims, 6 Drawing Sheets

(56) References Cited

U.S. PATENT DOCUMENTS

| | | | |
|---|---|---|---|
| 2007/0127918 A1 | 6/2007 | Ames et al. | |
| 2017/0262772 A1 | 9/2017 | Takigawa et al. | |
| 2017/0304942 A1* | 10/2017 | Ogata | H01S 5/0683 |

FOREIGN PATENT DOCUMENTS

| | | |
|---|---|---|
| JP | 2005-085871 | 3/2005 |
| JP | 2005-294449 | 10/2005 |
| JP | 2009-026889 | 2/2009 |
| JP | 2011-198971 | 10/2011 |
| JP | 2011-199079 | 10/2011 |
| JP | 2012-079966 | 4/2012 |
| JP | 2012-084630 | 4/2012 |
| JP | 2012-222322 | 11/2012 |
| JP | 2016-78050 | 5/2016 |
| JP | 2016-081994 | 5/2016 |
| JP | 2016-203232 | 12/2016 |
| JP | 2017-163036 | 9/2017 |
| WO | 2015/145742 | 10/2015 |

OTHER PUBLICATIONS

International Search Report of PCT application No. PCT/JP2019/016096 dated Jul. 9, 2019.

Extended European Search Report issued Jun. 1, 2021 in related European Patent Application No. 19804359.8.

* cited by examiner

IV characteristics of the laser modules diagnosis map

LASER OSCILLATION DEVICE FOR DIRECT-DIODE LASER METHOD AND FAILURE DIAGNOSIS METHOD FOR LASER OSCILLATION DEVICE

This application is a continuation of the PCT International Application No. PCT/JP2019/016096 filed on Apr. 15, 2019, which claim the benefit of foreign priority of Japanese patent application No. 2018-096572 filed on May 18, 2018, the contents all of which are incorporated herein by reference.

TECHNICAL FIELD

The present invention relates to a direct-diode laser oscillator, which is mainly used for laser processing such as cutting and welding, and also relates to a method for fault diagnosis in the direct-diode laser oscillator.

BACKGROUND ART

Patent Literatures 1 and 2 each disclose a power supply for driving laser diodes that includes an abnormality detector for determining the presence or absence of abnormality in the power supply based on the current applied to these laser diodes, and also discloses a fiber laser processing apparatus including such as power supply.

CITATION LIST

Patent Literature

PTL 1: Japanese Unexamined Patent Application Publication No. 2012-79966
PTL 2: Japanese Unexamined Patent Application Publication No. 2012-84630

SUMMARY OF THE INVENTION

Technical Problems

FIG. 6 shows laser processing system 100. System 100 includes the following: laser oscillator 1; optical fiber 2 for guiding the laser beams oscillated by laser oscillator 1; laser processing head 3 for collecting the laser beams guided through optical fiber 2 and emitting a laser beam toward the workpiece; laser robot 4 for guiding laser processing head 3 fixed at its tip toward the workpiece; system controller 5 for controlling laser oscillator 1 and laser robot 4; and teach pendant 6 connected to system controller 5. FIG. 6 further shows communication lines L1 and L2.

Laser oscillator 1, which is of direct-diode laser type, includes the following: laser modules 10 each including a plurality of laser diodes LD connected in series or in parallel; power supply circuit 20 for driving laser modules 10 at a constant current; and power controller 30 for controlling power supply circuit 20 based on the commands from system controller 5.

In short, laser oscillator 1 includes a plurality of laser modules and a beam multiplexer. The laser modules can make the laser diodes emit laser beams and the beam multiplexer to multiplex the laser beams into a single laser beam. The beam multiplexer, which includes reflective mirrors and a beam splitter, makes the laser beams emitted from the plurality of laser modules into a single light beam.

When laser processing system 100 is used to laser-process a workpiece, system controller 5 supplies laser robot 4 with scan commands containing a scan trajectory so that the laser beam can be applied to the desired position of the workpiece, and also supplies power controller 30 with laser-driving commands so that the laser beam can be applied to the desired position.

To obtain the light intensity indicated by the commands from system controller 5, power controller 30 controls power supply circuit 20 to make it supply laser modules 10 with a drive current corresponding to the light intensity.

In this case, the drive current and voltage applied from power supply circuit 20 to laser modules 10 are detected by a current sensor and a voltage sensor, respectively, and the detected values are supplied from laser oscillator 1 to system controller 5 through a signal line S. System controller 5 diagnoses whether laser oscillator 1 is operating properly based on whether the values of the current and voltage sensors exceed predetermined allowable thresholds. To be more specific, when the values exceed these thresholds, system controller 5 diagnoses laser oscillator 1 as faulty and issues STOP commands to laser oscillator 1.

However, when system controller 5 detects a fault in laser oscillator 1 during the diagnosis based on the value of the current applied to laser modules 10 and issues the STOP commands to laser oscillator 1, it takes a certain time for laser oscillator 1 to come to a stop after the fault detection. This time delay can cause additional faults.

The display unit of system controller 5 or teach pendant 6 could be configured to display fault codes indicating faults in laser oscillator 1 for the purpose of fault recovery. However, the cause of each fault could not be identified, and all possible causes would have to be considered, requiring a significant amount of time for recovery.

To overcome the above disadvantages, an object of the present invention is to provide a direct-diode laser oscillator that can detect a fault quickly enough not to cause additional faults and can easily narrow down the possible causes of the fault, and further to provide a method for fault diagnosis in the laser oscillator.

Solutions to Problems

An aspect of the present invention is to provide a direct-diode laser oscillator for emitting laser light to a laser processing head based on a driving command received from a system controller that controls a laser robot including the laser processing head. The direct-diode laser oscillator includes the following:
  a laser module including a plurality of laser diodes connected in series or in parallel;
  a power supply circuit for driving the laser module at a constant current; and
  a power controller for controlling the power supply circuit based on the driving command, and performing a fault diagnosis of the direct-diode laser oscillator based on which one of a plurality of previously divided regions of a diagnosis map the current and voltage applied to the laser module belong to.

Another aspect of the present invention is to provide a method for fault diagnosis in a direct-diode laser oscillator including the following:
  a laser module including a plurality of laser diodes connected in series or in parallel;
  a power supply circuit for driving the laser module at a constant current; and
  a power controller for controlling the power supply circuit. The method includes performing the fault diagnosis in the direct-diode laser oscillator, by the power controller, based on which one of a plurality of previously divided regions of a diagnosis map the current and voltage applied to the laser module belong to.

Advantageous Effects of Invention

The present invention provides a direct-diode laser oscillator that can detect a fault quickly enough not to cause additional faults and can easily narrow down the possible causes of the fault, and further provides a method for fault diagnosis in the laser oscillator.

The attached claims describe novel features of the present invention. However, the present invention will be better understood in structure and content from the following detailed description including a plurality of embodiments with reference to the drawings.

DESCRIPTION OF EXEMPLARY EMBODIMENT

Figure 1:
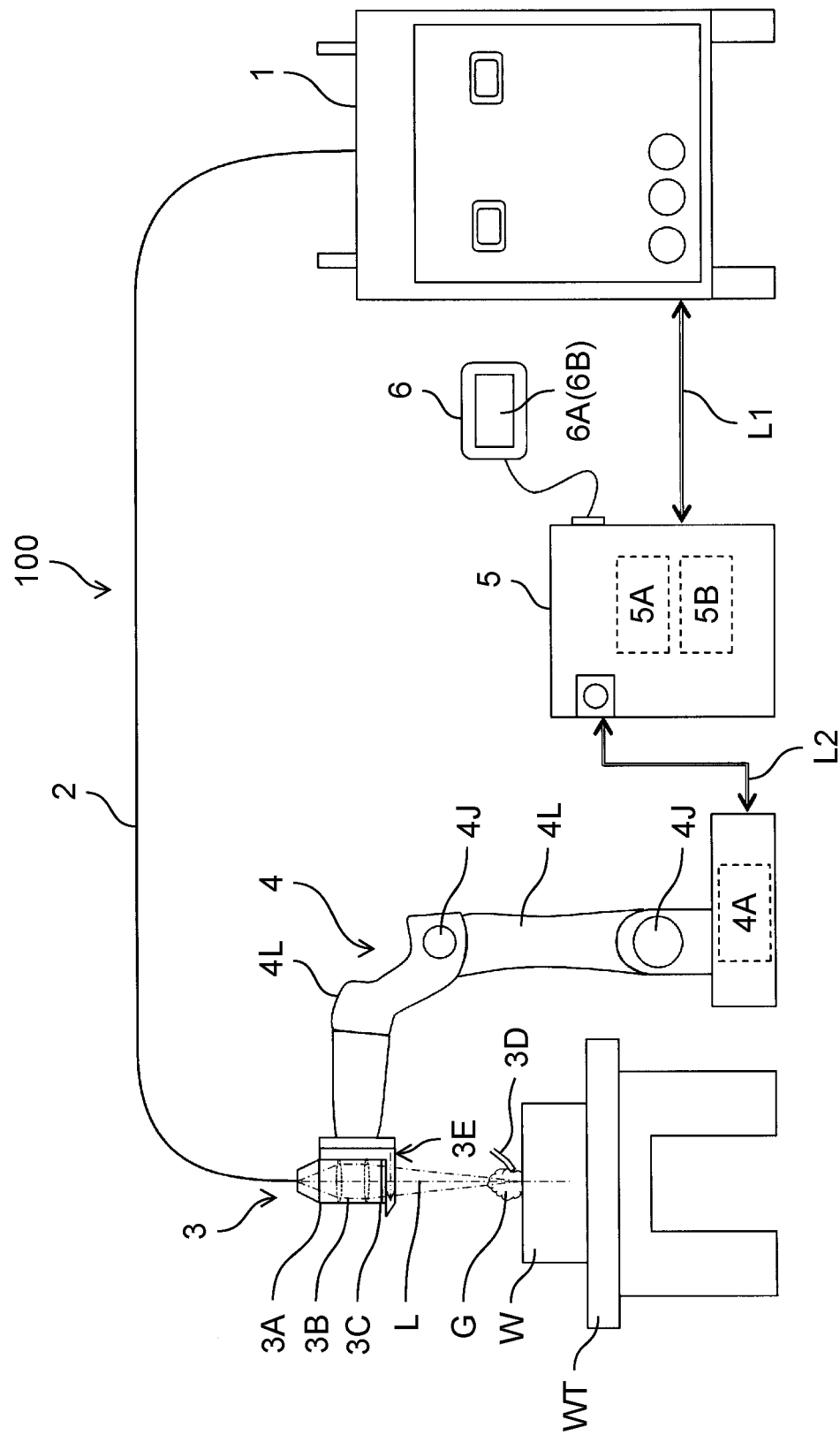
FIG. 1 is a diagram showing a laser processing system including a laser oscillator according to an exemplary embodiment of the present invention.

An exemplary embodiment of a direct-diode laser oscillator and a method for fault diagnosis in the laser oscillator according to the present invention will now be described with reference to drawings.

Basic Aspect

The direct-diode laser oscillator according to the present invention can emit laser light to a laser processing head based on the driving commands received from a system controller for controlling a laser robot including the laser processing head. The laser oscillator includes the following: a laser module including a plurality of laser diodes connected in series or in parallel, a power supply circuit for driving the laser module at a constant current, and a power controller for controlling the power supply circuit based on the driving commands from the system controller and for performing a fault diagnosis of the laser oscillator based on which of a plurality of previously divided regions of a diagnosis map the current and voltage applied to the laser modules belong to.

The power controller controls the power supply circuit based on the driving commands received from the system controller so as to make the power supply circuit apply a predetermined value of current to the laser modules. As a result, the laser modules supply the laser processing head with laser light of a predetermined intensity. To apply the predetermined value of current to the laser modules, the power controller controls the power supply circuit based on the current and voltage applied to the laser modules that are detected as feedback signals. During this control, the normality or abnormality of the laser oscillator is determined based on which of the divided regions of the diagnosis map, which include combinations of different current values and different voltage values, the applied current and voltage belong to.

The diagnosis map may be divided into a plurality of regions linked with predicted fault causes. The diagnosis map preferably includes the following regions: a normal region where at least the applied current and voltage are in a normal range and the other regions located above and below the normal region. Thus, the diagnosis map is preferably composed of a plurality of regions divided based on the values of at least the applied current and voltage. As a specific example, the diagnosis map can be divided into the following regions: a region (normal range) with a normal current value and a normal voltage value; a region with an overcurrent value regardless of the voltage value; a region with an excessively low current value regardless of the voltage value; a region with an overvoltage value regardless of the current value; a region with an excessively high voltage value and a normal current value; and a region with an excessively low voltage value and a normal current value.

When the region, of the diagnosis map, corresponding to the detected applied current and voltage is identified, the cause of a fault linked with the region can be predicted, enabling rapid and smooth fault-recovery operation.

The power controller is preferably configured to stop the power supply circuit and to supply the system controller with fault diagnosis information when diagnosing the laser oscillator as faulty. The fault diagnosis information preferably contains the region information of the diagnosis map.

In this configuration, the power controller, which has diagnosed the laser oscillator as faulty, can immediately stop the power supply circuit, which is under the control of the power controller. This prevents additional faults from being caused by a time delay after the occurrence of a fault until the power supply circuit comes to a stop. Supplying the fault diagnosis information to the system controller enables the entire laser processing system to be stopped without any trouble. The fault diagnosis information, when containing the region information of the diagnosis map, can be given to the maintenance person through the system controller or the teach pendant, enabling rapid fault-recovery operation.

The method for fault diagnosis according to the present invention is a method for fault diagnosis in a direct-diode laser oscillator including the following components: a laser module including a plurality of laser diodes connected in series or in parallel; a power supply circuit for driving the laser module at a constant current; and a power controller for controlling the power supply circuit. The method includes performing the fault diagnosis in the direct-diode laser oscillator, by the power controller, based on which one of a plurality of previously divided regions of a diagnosis map the current and voltage applied to the laser module belong to.

The diagnosis map is divided into regions linked with the predicted fault causes. When the laser oscillator is diagnosed as faulty, the fault diagnosis information containing the region information of the diagnosis map is outputted.

Basic Aspect

As shown in FIG. 1, laser processing system 100 includes laser oscillator 1; optical fiber 2 for guiding the laser beams oscillated by laser oscillator 1; laser processing head 3 for collecting the laser beams guided through optical fiber 2 and emitting a laser beam toward the workpiece; laser robot 4 for guiding laser processing head 3 fixed at its tip toward the workpiece; system controller 5 for controlling laser oscillator 1 and laser robot 4; and teach pendant 6 connected to system controller 5.

Laser robot 4 includes a manipulator including articulated links 4L rotatably joined by joints 4J; and controller 4A for controlling the manipulator. Laser processing head 3 is attached to the tip of the manipulator.

System controller 5 includes electronic control circuits each including a CPU, a memory storing control programs to be executed by the CPU, and an input-output circuit. Each of the electronic control circuits is a functional block such as robot controller 5A for controlling laser robot 4 or laser oscillator controller 5B for controlling laser oscillator 1. System controller 5 is connected to laser oscillator 1 through a communication line L1, and is connected to laser robot 4 through a communication line L2.

Laser processing head 3 includes the following: casing 3A attached to the tip of the manipulator via a bracket; light-gathering optical system 3B accommodated in casing 3A; and protective glass 3C.

The laser beams guided from laser oscillator 1 through optical fiber 2 to laser processing head 3 are collected by light-gathering optical system 3B and applied to the part to be welded of workpiece W placed on a work table WT.

Casing 3A includes a wire feed mechanism 3D for supplying a welding wire to the part to be welded. Mechanism 3D is equipped with a shielding gas nozzle for supplying shielding gas around the welding wire. The welding wire supplied by mechanism 3D is melted by the laser beam, thereby welding the workpiece W. To prevent the metal melted during the welding from oxidation in ambient air, shielding gas G such as argon is supplied to the part to be welded.

Note that the shielding gas nozzle alone is illustrated as wire feed mechanism 3D in FIG. 1. In reality, however, the body of mechanism 3D is attached on the lateral wall of casing 3A so that the tip of the shielding gas nozzle reaches the part to be welded.

Laser processing head 3 further includes antifouling gas supplier 3E between protective glass 3C and workpiece W. Gas supplier 3E ejects antifouling gas in the direction crossing the optical axis L of the laser beams, thereby antifouling protective glass 3C.

Teach pendant 6 includes the following: a communication interface circuit for communicating with system controller 5; display unit 6A for displaying various kinds of information; and data setting unit 6B for setting welding conditions.

The teacher can operate data setting unit 6B of teach pendant 6 to enter teaching data such as operating parameters for the manipulator of laser robot 4 and welding parameters (including, e.g., the intensity or repetition frequency of the laser light) for laser processing head 3 and laser oscillator 1. An assembly of the entered teaching data, or in other words, teaching information, is sent from teach pendant 6 to system controller 5 via the communication interface circuit, and stored in the memory of system controller 5.

System controller 5 makes its calculation unit perform an arithmetic operation based on the teaching information read from the memory at the start of welding. Device 5 then supplies laser robot 4 with operation commands and laser oscillator 1 with driving commands to encourage the oscillation of laser beams. As welding proceeds, system controller 5 updates the necessary commands and sends them to laser robot 4, laser oscillator 1, and laser processing head 3. This results in controlling laser robot 4, laser oscillator 1, and laser processing head 3 as specified in the teaching data. Laser processing head 3 is controlled through controller 4A of laser robot 4. The commands sent to laser processing head 3 contain a command to eject antifouling gas.

Figure 2:
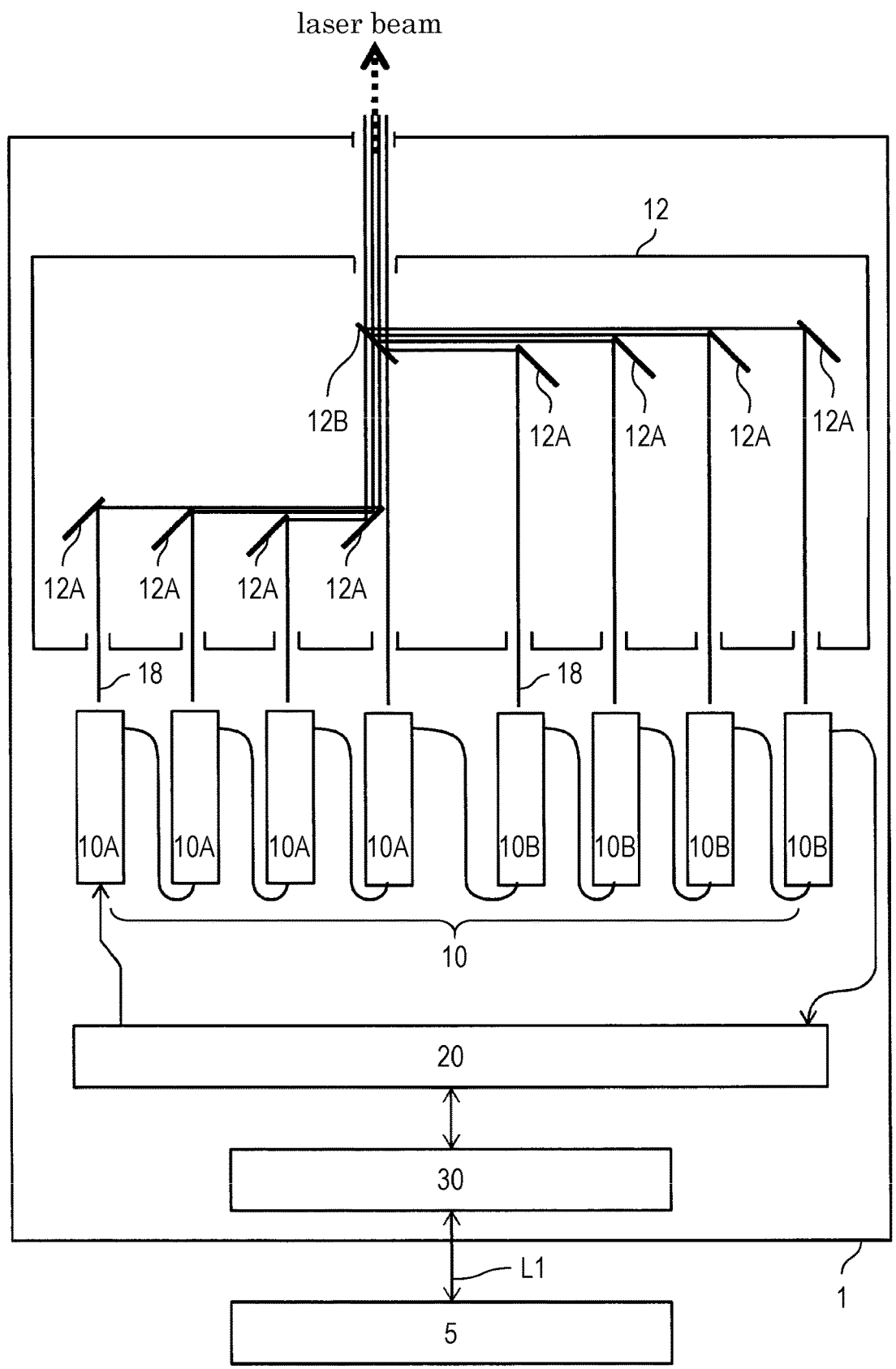
FIG. 2 is a diagram showing the laser oscillator.

FIG. 2 shows an example of laser oscillator 1. Laser oscillator 1, which is of direct-diode laser type, includes the following: a plurality of laser modules 10 (10A, 10B) each including a plurality of laser diodes LD connected in series or in parallel; beam multiplexer 12 for multiplexing the laser beams emitted from laser modules 10 (10A, 10B) into a single laser beam; power supply circuit 20 for driving laser modules 10 (10A, 10B) at a constant current; and power controller 30 for controlling power supply circuit 20 based on the driving commands from system controller 5.

Beam multiplexer 12 includes reflective mirrors 12A and beam splitter 12B. The p-polarized laser beams from laser modules 10A and the s-polarized laser beams from laser modules 10B, which have polarization planes perpendicular to each other, strike reflective mirrors 12A to be spatially combined. The spatially combined laser beams are polarization combined by beam splitter 12B. Reflective mirrors 12A are placed so as to prevent the laser beams from interfering with each other.

Laser modules 10 (10A, 10B) are configured to emit a single laser beam obtained by multiplexing the laser beams emitted from the laser diodes inside these modules 10. The light intensity of the laser beams is adjusted according to the value of the current supplied from power supply circuit 20 connected to laser modules 10 (10A, 10B). The maximum intensity of laser modules 10 (10A, 10B) is set to, for example, 1 kW or so.

Laser modules 10 (10A, 10B) are series-connected to the constant-current circuit in power supply circuit 20. Circuit 20 applies a predetermined value of current to laser modules 10 (10A, 10B), so that modules 10 (10A, 10B) emit laser beams with the same output level. The present exemplary embodiment uses eight-connected laser modules of 1 kW, so that the maximum light intensity of the laser beams is 8 kW. The number of the laser modules is not limited to eight and can be increased or decreased depending on the maximum output of laser oscillator 1.

Figure 3:
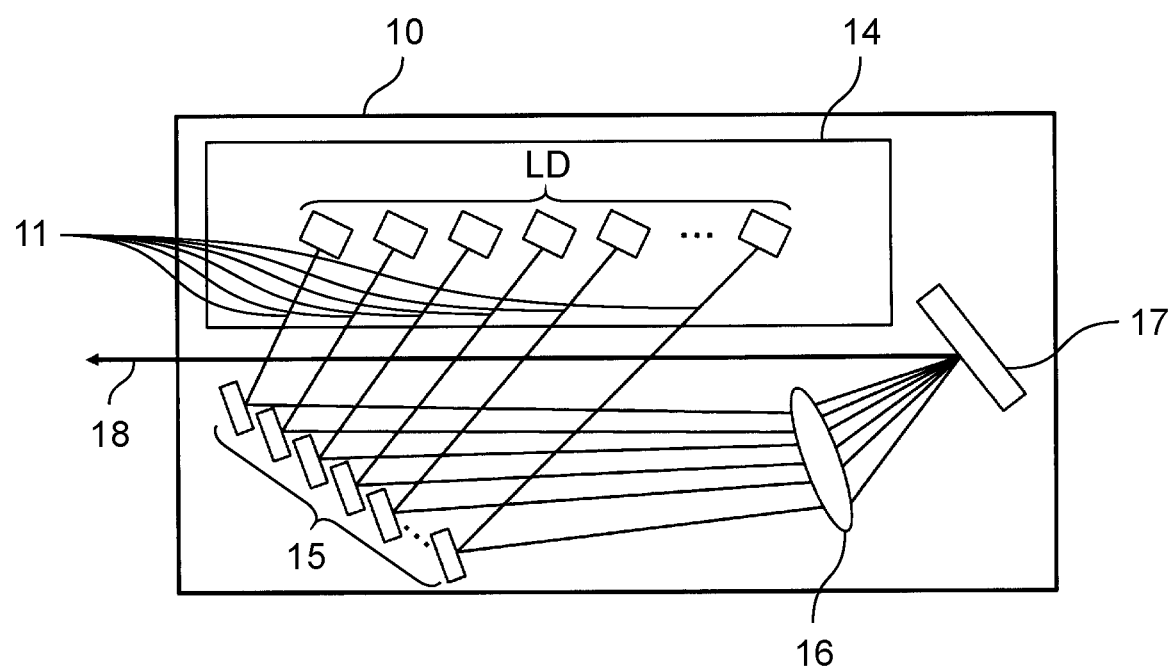
FIG. 3 is a diagram showing one laser module.

FIG. 3 shows the configuration of laser modules 10. Laser modules 10 includes a plurality of laser diodes LD mounted on cooling plate 14 and optical elements for accomplishing spectral beam combining of the multiple-wavelength laser beams.

Laser modules 10 are configured to emit single laser beam 18 by superimposing laser beams 11 of multiple wavelengths $\lambda 1, \lambda 2, \lambda 3, \ldots \lambda n$ using total reflection mirror 15, condense lens 16, and diffraction grating 17. Laser modules 10 are miniaturized to achieve optical resonance and the superimposition of the laser beams in a confined space using total reflection mirror 15. Laser diodes LD do not all have to be connected in series; alternatively, some of them can be connected in parallel.

Laser beam 18 obtained from the superimposition performed by diffraction grating 17 is emitted from laser modules 10 and is spatially and polarization combined with the laser beams emitted from the other laser modules 10 as described above. The laser beam obtained by the combination is guided through optical fiber 2 (see FIG. 1) to laser processing head 3.

Figure 4:
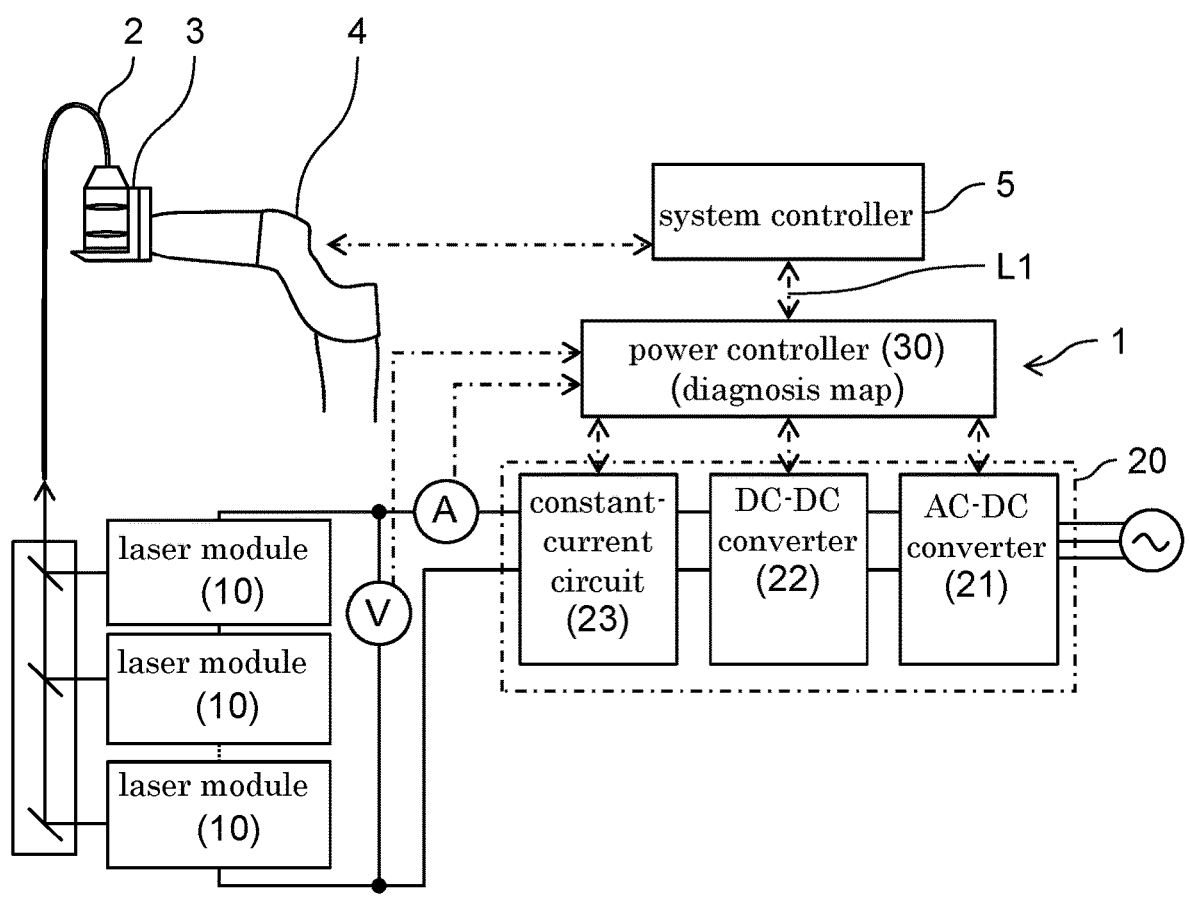
FIG. 4 is a functional block diagram showing a power supply circuit and a power controller, both of which are included in the laser oscillator.

FIG. 4 shows the circuit block diagram of power supply circuit 20 and power controller 30 included in laser oscillator 1. Power supply circuit 20 includes the following: AC-DC converter 21 for converting AC power supplied from a three-phase commercial power supply into DC power; DC-DC converter 22 for adjusting the DC output voltage of AC-DC converter 21 to a predetermined DC voltage; and constant-current circuit 23 for receiving the DC voltage of the DC-DC converter and outputting a predetermined constant DC current. These components are configured to output a desired DC voltage or current by adjusting the switching period of the semiconductor switching device.

Power controller 30 includes a microcomputer and a memory circuit storing control programs. The microcomputer includes a CPU, which executes the control programs so as to control the output of each of AC-DC converter 21, DC-DC converter 22, and constant-current circuit 23.

Power controller 30 includes a voltage sensor V for detecting the voltage across each laser module 10 and a current sensor A for detecting the current supplied to each laser module 10. Controller 30 feedback-controls constant-current circuit 23 based on the values of these sensors V and A, so that a DC current or pulsed current is applied to series-connected laser modules 10 based on the driving commands from system controller 5.

The driving commands include, as parameters, the following: the light intensity of the laser beam emitted from laser oscillator 1; a choice between continuous light and pulsed light; and the period of the pulsed light if it is chosen. Power controller 30 controls constant-current circuit 23 so that a current whose value corresponds to the values of the parameters can be applied to laser modules 10.

Figure 5A:
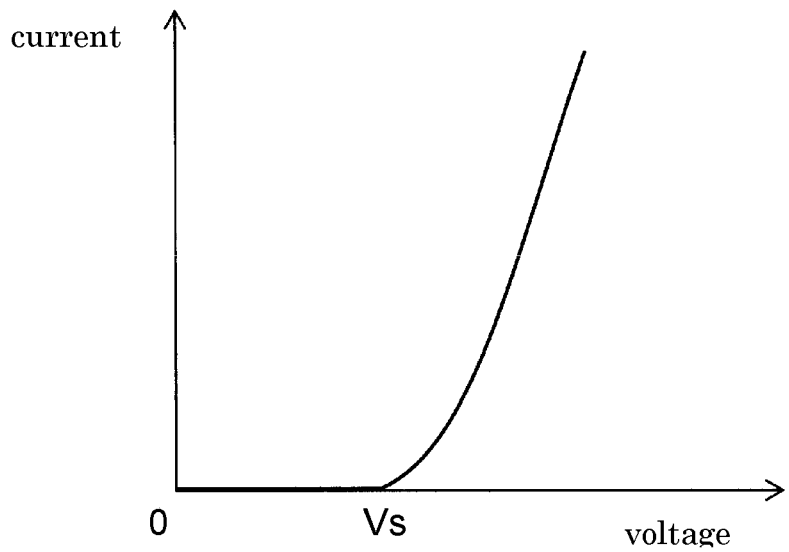
FIG. 5A is a current-voltage characteristic diagram of the laser modules.

FIG. 5A shows an example of the current-voltage characteristics of laser modules 10. The characteristics differ depending on the number of series-connected laser modules 10, or whether laser modules 10 are driven in a pulsed or continuous wave mode, but are similar in general tendencies. The light-up voltage Vs differs depending on the number of series-connected laser diodes LD.

Power controller 30 is configured to perform fault diagnosis in laser oscillator 1 based on the values of the voltage sensor V and current sensor A detected during actual control. To be more specific, the diagnosis map, which is previously divided into a plurality of regions corresponding to the values of the current and voltage applied to laser modules 10, is stored in the memory circuit. The fault diagnosis is performed based on which of the plurality of regions of the diagnosis map the current and voltage applied to laser modules 10 belong to.

Figure 5B:
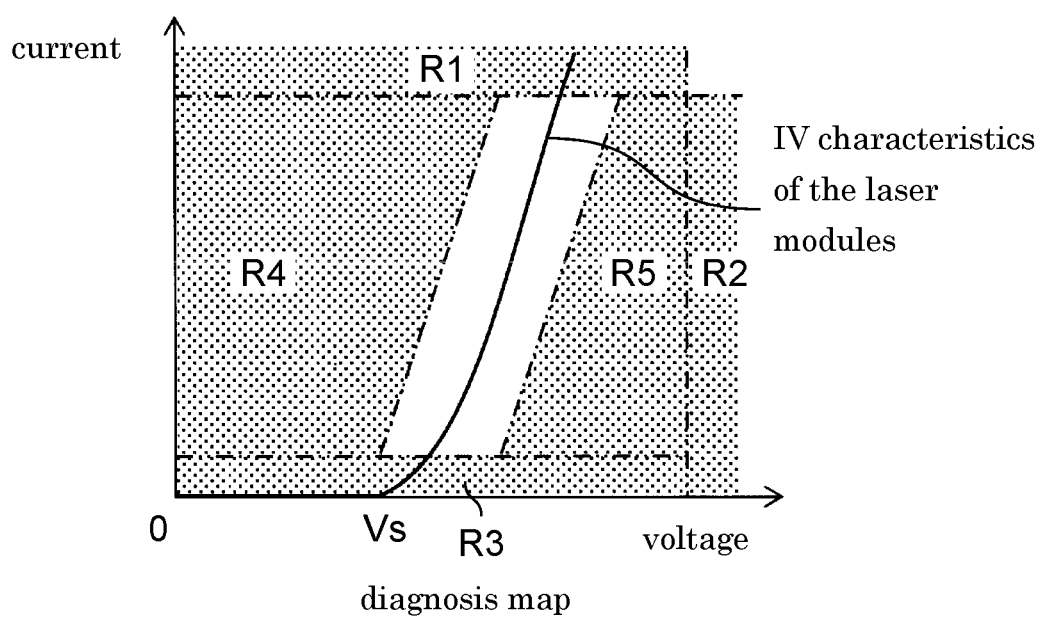
FIG. 5B is a diagram showing a diagnosis map.
Figure 6:
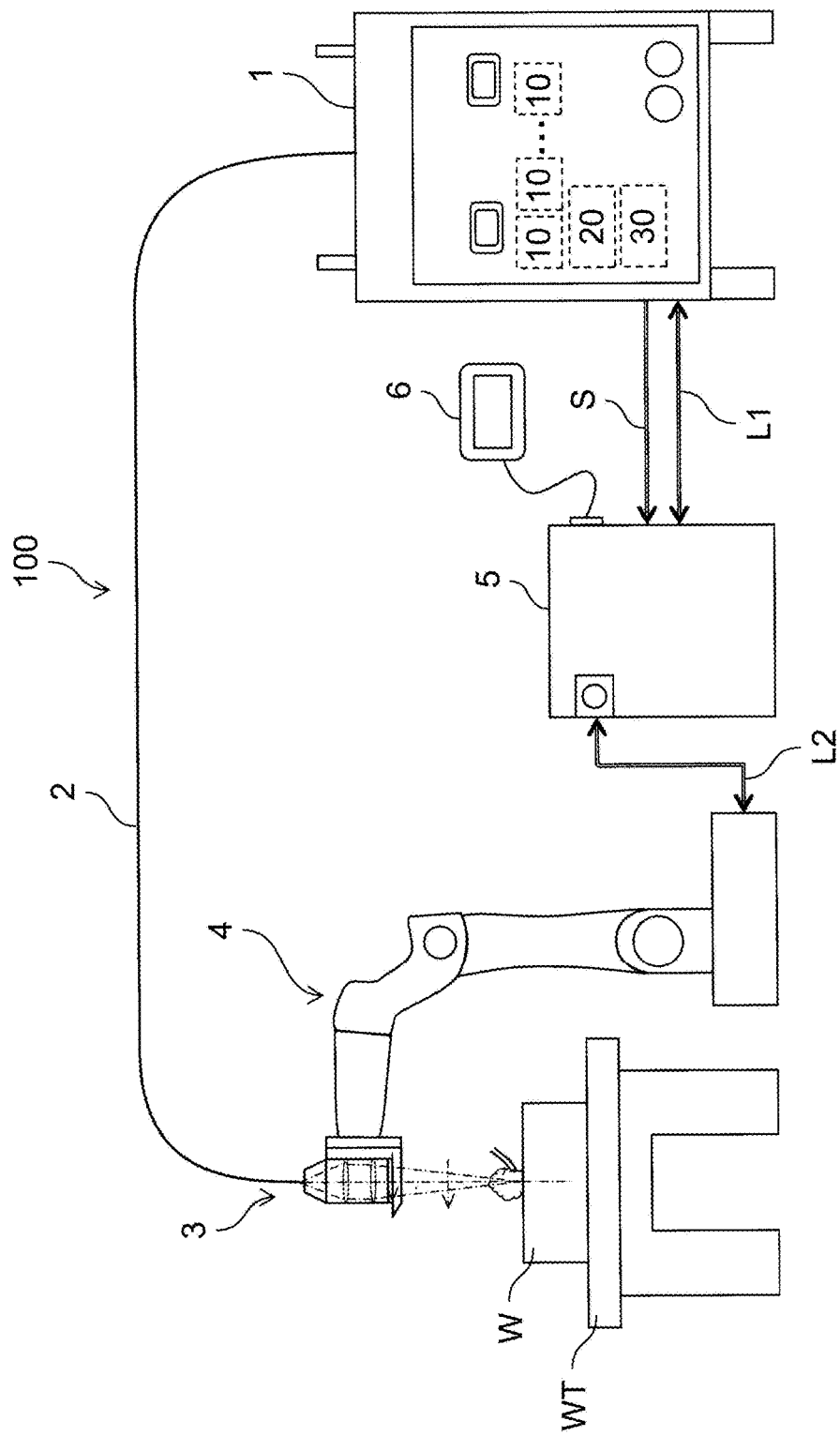
FIG. 6 is a diagram showing a laser processing system including a different laser oscillator.

FIG. 5B shows an example of the diagnosis map. This diagnosis map is divided into a normal region (the hollow region in FIG. 5B) where the applied current and voltage are in a normal range in the current-voltage space and five other regions R1 to R5 located above and below the hollow region. Thus, the map is divided into one normal region in the normal range and five other regions. Each region is linked with the corresponding predicted fault cause.

Region R1 is an abnormal region with an overcurrent value regardless of the voltage value. In this region, constant-current circuit 23 of power supply circuit 20 is not working properly. This indicates that power controller 30 and constant-current circuit 23 are likely to be faulty.

Region R2 is an abnormal region with an overvoltage value regardless of the current value. If a fault is observed from the beginning of the driving operation, it is determined that the wires are likely to be wrongly connected. If a fault is observed after laser oscillator 1 operates normally for a while, this indicates that laser modules 10 are likely to have an open mode failure.

Region R3 is an abnormal region with an excessively low current value regardless of the voltage value. This can be determined that the power supply is at fault.

Region R4 is an abnormal region with an excessively low voltage value and the normal current value. This indicates that a part of laser diodes LD in laser modules 10 is likely to have a short-circuit mode failure.

Region R5 is an abnormal region with an excessively high voltage value and a normal current value. This indicates that a part of laser diodes LD in laser modules 10 is likely to have an open mode failure.

The diagnosis map shown in FIG. 5B is just one example, and the current-voltage characteristics differ depending on the number of series-connected laser modules 10, or whether laser modules 10 light on either continuously or intermittently in pulses. Hence, it is preferable to prepare different types of diagnosis maps with reference to a plurality of typical current-voltage characteristics and to perform a fault diagnosis using a diagnosis map corresponding to the parameters contained in the driving commands or to the number of series-connected laser modules 10.

Power controller 30 is configured to stop power supply circuit 20 and to supply system controller 5 with the fault diagnosis information containing the region information of the diagnosis map when diagnosing laser oscillator 1 as faulty. Either the display unit of system controller 5 or teach pendant 6 is configured to display fault codes corresponding to the faults. This configuration enables the maintenance person to acquire the fault diagnosis information from system controller 5, thereby achieving rapid fault-recovery operation.

In the above-described exemplary embodiment, the diagnosis map has a two-dimensional space divided into a plurality of regions corresponding to the current and voltage applied to laser modules 10. Alternatively, the diagnosis map may have a three-dimensional space, which includes a temperature index of laser modules 10 and is divided into a plurality of regions. When laser modules 10 have an abnormally high temperature, it is additionally determined that laser diodes LD are likely to have a short-circuit mode failure. When laser modules 10 have an abnormally low temperature, it is additionally determined that laser diodes LD are likely to have an open mode failure. When laser modules 10 are in the normal temperature range, it is additionally determined that the laser diodes LD have no abnormality.

The above-described exemplary embodiment is just one example of the present invention. The specific structures of the components are not limited to the above described examples, and needless to say, these structures can be properly modified within the range in which the present invention can be effective.

INDUSTRIAL APPLICABILITY

The present invention provides a direct-diode laser oscillator that can detect a fault quickly enough not to cause additional faults and can easily narrow down the possible causes of the fault. The present invention has been described with respect to preferred embodiments as of this point in time; however, this disclosure should not be definitely interpreted.

Various deformations and modifications will be apparent from the above disclosure to a person having ordinary skill in the art. Therefore, the attached claims should be interpreted as including all deformations and modifications within the spirit of the present invention.

REFERENCE MARKS IN THE DRAWINGS

100 laser processing system
1 laser oscillator
10, 10A, 10B laser module
12A reflective mirror 12B beam splitter
LD laser diode
15 total reflection mirror
16 condense lens
17 diffraction grating
20 power supply circuit
30 power controller
2 optical fiber
3 laser processing head
4 laser robot
5 system controller
5A robot controller
5B laser oscillator controller
6 teach pendant

The invention claimed is:

1. A direct-diode laser oscillator configured to emit laser light to a laser processing head based on a driving command received from a system controller, the system controller being configured to control a laser robot including the laser processing head, the direct-diode laser oscillator comprising:
  a laser module including a plurality of laser diodes connected in series or in parallel;
  a power supply circuit configured to drive the laser module at a constant current; and
  a power controller configured to
    control the power supply circuit based on the driving command, and
    perform a fault diagnosis of the direct-diode laser oscillator based on which one of a plurality of previously divided regions of a diagnosis map a current and a voltage applied to the laser module belong to,
  wherein the power controller includes the diagnosis map which is previously divided into a plurality of regions corresponding to values of current and voltage applied to the laser module,
  wherein the diagnosis map comprises:
    a normal region in which, in the diagnosis map, a value of current applied to the laser module is smaller than a first predetermined current and is larger than a second predetermined current which is smaller than the first predetermined current, and a value of voltage applied to the laser module is larger than a first predetermined voltage and is smaller than a second predetermined voltage which is larger than the first predetermined voltage;
    a first abnormal region R1 in which, in the diagnosis map, the value of current applied to the laser module is larger than the first predetermined current regardless of the value of voltage and where the power controller determines that the power controller and the power supply circuit are likely to be faulty;
    a second abnormal region R2 in which, in the diagnosis map, the value of voltage applied to the laser module is larger than a third predetermined voltage regardless of the value of current and where the power controller determines that, if a fault is observed from a start time of a driving operation, wires are likely to be wrongly connected and, if the fault is observed after the direct-diode laser oscillator operates for a time frame after a start of the driving operation, the laser module is likely to have an open mode failure;
    a third abnormal region R3 in which, in the diagnosis map, the value of current applied to the laser module is smaller than the second predetermined current regardless of the value of voltage and where the power controller determines that the power supply circuit is at fault;
    a fourth abnormal region R4 in which, in the diagnosis map, the value of voltage applied to the laser module is smaller than the first predetermined voltage which is smaller than the third predetermined voltage and where the power controller determines that a part of the laser diodes in the laser module is likely to have a short-circuit mode failure; and
    a fifth abnormal region R5 in which, in the diagnosis map, the value of voltage applied to the laser module is larger than the second predetermined voltage and is smaller than the third predetermined voltage and where the power controller determines that the part of the laser diodes in the laser module is likely to have an open mode failure.

2. The direct-diode laser oscillator according to claim 1, wherein the plurality of previously divided regions of the diagnosis map are linked with corresponding predicted fault causes.

3. The direct-diode laser oscillator according to claim 1, wherein when diagnosing the direct-diode laser oscillator as faulty, the power controller stops the power supply circuit and sends the system controller fault diagnosis information.

4. The direct-diode laser oscillator according to claim 3, wherein the fault diagnosis information contains region information of the diagnosis map.

5. A method for fault diagnosis in a direct-diode laser oscillator, the direct-diode laser oscillator comprising:
  a laser module including a plurality of laser diodes connected in series or in parallel;
  a power supply circuit configured to drive the laser module at a constant current; and
  a power controller configured to control the power supply circuit,
  wherein the power controller includes a diagnosis map which is previously divided into a plurality of regions corresponding to values of current and voltage applied to the laser module,
  the method comprising performing the fault diagnosis in the direct-diode laser oscillator, by the power controller, based on which one of a plurality of previously divided regions of the diagnosis map a current and a voltage applied to the laser module belong to,
  wherein the diagnosis map comprises:
    a normal region in which, in the diagnosis map, a value of current applied to the laser module is smaller than a first predetermined current and is larger than a second predetermined current which is smaller than the first predetermined current, and a value of voltage applied to the laser module is larger than a first predetermined voltage and is smaller than a second predetermined voltage which is larger than the first predetermined voltage;
    a first abnormal region R1 in which, in the diagnosis map, the value of current applied to the laser module is larger than the first predetermined current regardless of the value of voltage and where the power controller determines that the power controller and the power supply circuit are likely to be faulty;
    a second abnormal region R2 in which, in the diagnosis map, the value of voltage applied to the laser module is larger than a third predetermined voltage regardless of the value of current and where the power controller determines that, if a fault is observed from a start time of a driving operation, wires are likely to be wrongly connected and, if the fault is observed after the direct-diode laser oscillator operates for a time frame after a start of the driving operation, the laser module is likely to have an open mode failure;

a third abnormal region R3 in which, in the diagnosis map, the value of current applied to the laser module is smaller than the second predetermined current regardless of the value of voltage and where the power controller determines that the power supply circuit is at fault;

a fourth abnormal region R4 in which, in the diagnosis map, the value of voltage applied to the laser module is smaller than the first predetermined voltage which is smaller than the third predetermined voltage and where the power controller determines that a part of the laser diodes in the laser module is likely to have a short-circuit mode failure; and a fifth abnormal region R5 in which, in the diagnosis map, the value of voltage applied to the laser module is larger than the second predetermined voltage and is smaller than the third predetermined voltage and where the power controller determines that the part of the laser diodes in the laser module is likely to have an open mode failure.

6. The method according to claim 5, wherein the plurality of previously divided regions of the diagnosis map are linked with corresponding predicted fault causes, and the method further comprises outputting fault diagnosis information containing region information of the diagnosis map when the power controller diagnoses the direct-diode laser oscillator as faulty.

\* \* \* \* \*